(12) United States Patent
Tanaka

(10) Patent No.: US 6,380,595 B1
(45) Date of Patent: Apr. 30, 2002

(54) SEMICONDUCTOR DEVICE AND MANUFACTURING METHOD THEREFOR

(75) Inventor: Akihiko Tanaka, Chiyoda-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/314,288

(22) Filed: May 19, 1999

(30) Foreign Application Priority Data

May 25, 1998 (JP) ............................................ 10-159955

(51) Int. Cl.[7] .................... H01L 29/76; H01L 29/94; H01L 29/00; H01L 23/48; H01L 21/4763
(52) U.S. Cl. .................... 257/375; 257/546; 257/763; 438/630
(58) Field of Search ................................ 438/300, 630, 438/647, 655, 657; 257/371, 369, 351, 763, 204, 355–360, 546, 375

(56) References Cited

U.S. PATENT DOCUMENTS 5,355,010 A * 10/1994 Fuji et al. .................... 257/377

* cited by examiner

*Primary Examiner*—Olik Chaudhuri
*Assistant Examiner*—Shrinivas H. Rao
(74) *Attorney, Agent, or Firm*—William B. Kempler; Frederick J. Telecky, Jr.

(57) ABSTRACT

The objective of the invention is to make the n-type silicon region, that relatively strongly and adversely affects the dependence of titanium silicide resistance on wire thickness, as small as possible, in common gate electrode wiring with a CMOS structure. The region, into which ions of n-type impurity 6 are implanted, is only the element region of a p-type substrate region, and all the rest of the gate electrode wiring, on the n-type substrate region and field region, is constituted by p-type polysilicon, with relatively good low-resistance titanium silicide formation.

3 Claims, 5 Drawing Sheets

SEMICONDUCTOR DEVICE AND MANUFACTURING METHOD THEREFOR

FIELD OF THE INVENTION

This invention pertains to a semiconductor device with a so-called CMOS structure, where an n-channel insulating gate field-effect transistor (especially MOSFET) and a p-channel insulating gate field-effect transistor (especially MOSFET) are connected by common gate electrode wiring, and to a manufacturing method therefor.

BACKGROUND OF THE INVENTION

FIG. 12 shows the partial schematic construction of a device with a conventional CMOS structure where an n-channel MOSFET and a p-channel MOSFET are connected by common gate electrode wiring.

As shown in FIG. 12(a), for example, p-type region 101a, as a structure called a well (or tank), and n-type region 101b are each provided on the principal face of p-type silicon semiconductor substrate 101. An element formation region is delineated for each region by field oxide film 102. Then in each element formation region, common gate electrode wiring 103 is provided with intervening gate oxide film 108. Then in the element formation region of p-type region 101a, a pair of $n^+$ diffusion layers 104, that are implanted with ions of an n-type impurity at a relatively high concentration, is formed on both sides of gate electrode wiring 103. At the same time, a pair of $p^+$ diffusion layers 105, that are implanted with ions of a p-type impurity at a relatively high concentration, is formed on both sides of gate electrode wiring 103 in the element formation region of n-type region 101b. These constitute an n-channel MOSFET and p-channel MOSFET source and drain, respectively.

When a structure such as this is manufactured, generally $n^+$ diffusion layer 104 and $p^+$ diffusion layer 105, that are separate element formation regions, are each covered by a resist (masked) and formed with ion implantation. But when $n^+$ diffusion layer 104 is formed, in order to simplify and to make mask alignment easy, the photomask used when the well region discussed above was formed is used, n-type region 101b is covered by a resist and ion implantation performed, and when $p^+$ diffusion layer 105 is formed, likewise p-type region 101a is covered by a resist and ion implantation is performed. In this case, during ion implantation, field oxide film 102 and the polycrystal (poly) silicon layer that constitutes gate electrode wiring 103 act as masks.

For example, as shown in FIG. 12(b) when ions of n-type impurity 106 are implanted in the element formation region of p-type region 101a, all of n-type region 101b is covered by photoresist 107 and ions are implanted in all of exposed p-type region 101a, forming $n^+$ diffusion layer 104. On the other hand, when ions of a p-type impurity are implanted in the element formation region of n-type region 101b, conversely, all of p-type region 101a is covered by a photoresist and ions are implanted in all of exposed n-type region 101b, forming $p^+$ diffusion layer 105.

Thus, n-type and p-type impurities are each implanted in the polysilicon layer that constitutes gate electrode wiring 103. Conventionally, as shown in FIG. 12(b) all of the polysilicon layer on p-type region 101a would become an $n^+$ portion 103a, in which ions of an n-type impurity are implanted at a high concentration, and all of the polysilicon layer on n-type region 101b would become a $p^+$ portion 103b, in which ions of a p-type impurity are implanted at a high concentration.

For the gate electrode wiring discussed above, polycide wiring where the upper part of the polysilicon layer is silicided is normally used.

On the other hand, particularly in the case of titanium silicide, there has been the problem that, in order for the siliciding reaction to proceed and give lower resistance, crystal structure phase transition is necessary. But, for example, when the wire width is made smaller in order to make the gate narrower, it becomes hard to cause this phase transition, and the siliciding reaction stops, leaving relatively high resistance.

This dependence of titanium silicide on wire width also affects impurities in the polysilicon layer. It is especially noticeable in the case of n-type impurities, such as arsenic (As) and phosphorus (P). For example, if wire width is reduced to less than 0.5 µm, the rate of formation of low-resistance titanium silicide becomes poor. On the other hand, in the case of p-type impurities, such as boron (B), such a large effect does not occur and it is possible to form wires as thin as 0.3 µm, for example.

In addition, even with polysilicon layers doped with n-type impurity, there have been problems in that those on field oxide films have a poorer rate of low-resistance titanium silicide formation than those formed on element formation regions, and their formation states vary.

Due to these facts, with the partial schematic construction of a device with a conventional CMOS structure as shown in FIG. 12, if, for example, the width of gate electrode wiring 103 is made narrower in order to make gate width narrower, there has been the problem that the rate at which a titanium silicide layer, in particular, is formed in this gate electrode wiring 103 would be poor. For CMOS semiconductor devices currently manufactured, since there are regions into which $n^+$ ions are implanted on field oxide films, this has been a hindrance to making smaller elements, along with the drop in the siliciding reaction that accompanies the making of electrode wiring thinner, such as discussed above. Regions doped with n-type impurity, for example, such as of a DRAM formed in a p-type silicon well, become appreciably larger than regions doped with p-type impurity. Thus, using a manufacturing method such as discussed above, the area in which ions of an n-type impurity are implanted in a polysilicon layer, that is the electrode wiring, becomes larger, the conductor wiring region where the rate of formation of low-resistance titanium silicide is poor increases, and this would be one obstacle to making smaller elements.

So the objective of this invention is to provide a semiconductor device with a structure that is comparatively beneficial for forming a silicide layer, such as titanium silicide, in the common gate electrode wiring of CMOS structures, and to provide a manufacturing method therefor.

SUMMARY OF THE INVENTION

With the semiconductor device of this invention that is to solve the problems discussed above, being a semiconductor device where an n-channel insulating gate field-effect transistor and a p-channel insulating gate field-effect transistor are connected by common gate electrode wiring on the principal face of a semiconductor substrate, in the polycrystal silicon layer that constitutes said gate electrode wiring, n-type impurity is introduced into the element region of said n-channel insulating gate field-effect transistor and p-type impurity is introduced into the element region of said p-channel insulating gate field-effect transistor.

In addition, the semiconductor device manufacturing method of this invention has a process wherein a field region is formed on the principal face of a semiconductor substrate that has a first region of a first conductive type and a second region of a second conductive type and a first element region is delineated for said first region and a second element formation region is delineated for said second region, a process wherein, after gate insulating films are formed for said semiconductor substrate surface in said first and second element formation regions, a polycrystal silicon layer is formed into a gate electrode wiring pattern that extends through said first and second element formation regions on these gate insulating films and on said field region, a process wherein, after a mask is formed to cover said first element formation region, a first impurity of a first conductive type is introduced into said polycrystal silicon layer on said second element formation region and on said field region and into said semiconductor substrate surface region on both sides of said polycrystal silicon layer in said second element formation region, and a process wherein, after a mask is formed to cover said second element formation region and said field region, a second impurity of a second conductive type is introduced into said polycrystal silicon layer on said first element formation region and into said semiconductor substrate surface region on both sides of said polycrystal silicon layer in said first element formation region.

In the figures, 1 represents a silicon semiconductor substrate, 1a represents a p-type region, 1b represents a n-type region, 2 represents a field oxide film, 3 represents a gate electrode wiring, 3a represents a $n^+$ portion, 3b represents a $p^+$ portion, 4 represents a $n^+$ difussion layer, represents a $p^+$ diffusion layer, 6 represents n-type impurity, 7 represents a photoresist, 11 represents a silicon semiconductor substrate, 11a represents a p-type region, 11b represents a n-type region, 12 represents a field oxide film, 13 represents a gate oxide film, 14a, 14b, represents a polysiliconfilm, 15, 18, 22, 25 represents a photoresist, 16, 23 represents a p-type impurity, 17 represents a $p^-$ diffusion layer, 19, 26 represents a n-type impurity, 20 represents a n-diffusion layer, 21 represents a side wall insulating film, 24 represents a $p^+$ diffusion layer, 27 represents a $n^+$ diffusion layer, 28 represents a titanium (Ti) film, and 29 represents a titanium silicide layer.

DESCRIPTION OF EMBODIMENTS

Below, this invention is explained according to embodiments.

Embodiment 1

Figure 12A:
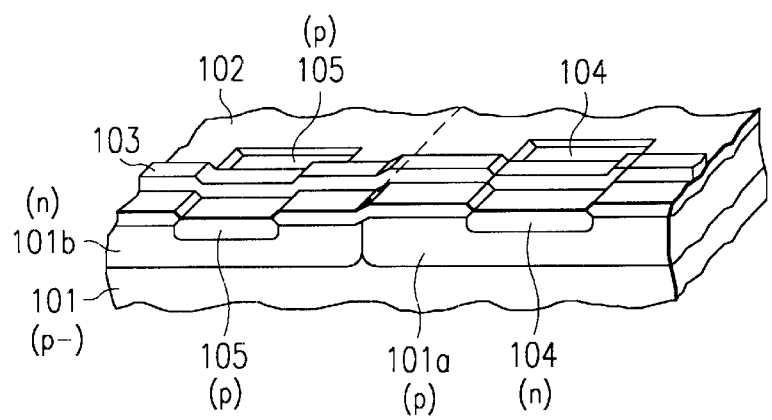
FIG. 12 is a schematic diagram and schematic cross section showing a conventional semiconductor device with CMOS construction.
Figure 12B:
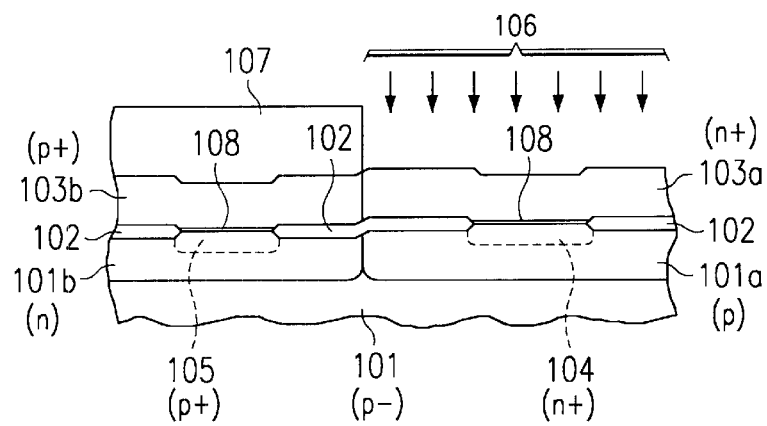

A constitution corresponding to the conventional constitution shown in FIG. 12 is shown in FIG. 1 as a embodiment 1 of this invention.

Figure 1A:
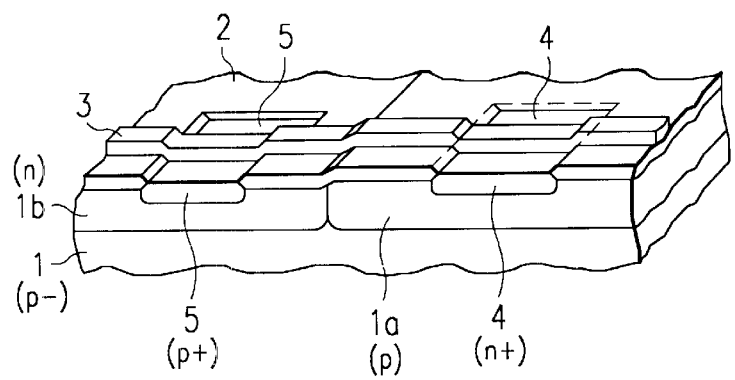
FIG. 1 is a schematic diagram and schematic cross section showing a semiconductor device with CMOS construction based on a embodiment 1 of this invention.

In short, as shown in FIG. 1(a), for example, p-type region 1a, as a structure called a well (or tank), and n-type region 1b are each provided on the principal face of $p^-$ silicon semiconductor substrate 1), and an element formation region is delineated in each region by field oxide film 2. Then in each element formation region, common gate electrode wiring 3 is provided with intervening gate oxide film 13. Then in the element formation region of p-type region 1a), a pair of $n^+$ diffusion layers 4), into which ions of an n-type impurity are implanted at a relatively high concentration, is formed on both sides of gate electrode wiring 3. At the same time, in the element formation region of n-type region 1b), a pair of $p^+$ diffusion layers 5), into which ions of a $p^+$ type impurity are implanted at a relatively high concentration, is formed. These constitute an n-channel MOSFET and p-channel MOSFET source and drain, respectively.

Figure 1B:
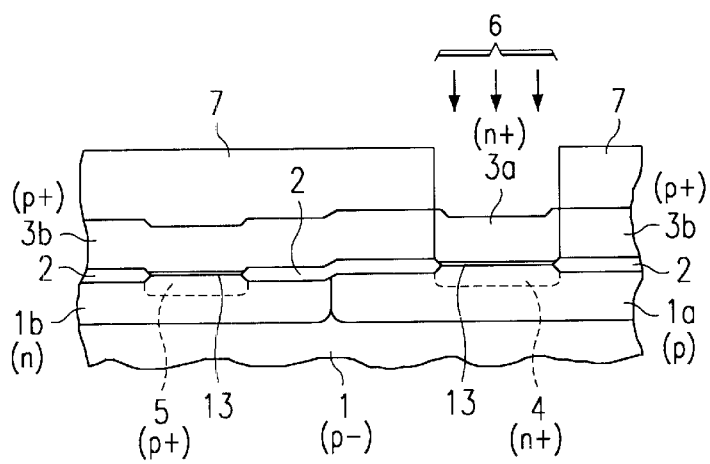

When the structure in FIG. 1(a) is manufactured, for example, as shown in FIG. 1(b), when ions of n-type impurity 6 are implanted into the element formation region of p-type region 1a, all of n-type region 1b and field oxide film 2 in p-type region 1a are covered by photoresist 7, and ions are implanted only in the exposed element formation region of p-type region 1a. On the other hand, when ions of a p-type impurity are implanted into the element formation region of n-type region 1b, conversely, only the element formation region of p-type region 1a is covered by a photoresist, and ions are implanted into all of n-type region 1b and field oxide film 2 in p-type region la that are exposed.

This, with this embodiment 1, in the polysilicon layer that constitutes gate electrode wiring 3, as shown in FIG. 1(b), only the element formation region of p-type region 1a becomes $n^+$ portion 3a, into which ions of an n-type impurity are implanted at a high concentration, and all of n-type region 1b and field oxide film 2 in p-type region 1a become $p^+$ portion 3b, into which ions of a p-type impurity are implanted at a high concentration.

In this way, with this embodiment 1, in the polysilicon layer that constitutes gate electrode wiring 3, $n^+$ portion 3a, that is a hindrance to titanium silicide formation, is present only on the element formation region of p-type region 1a, and all the portions other than this constitute $p^+$ portion 3b, that is comparatively beneficial for titanium silicide formation. Thus, when the upper part of this polysilicon layer is silicided to form a titanium silicide layer, it will be possible to form a titanium silicide layer that has sufficiently low resistance in nearly all portions of gate electrode wiring 3.

In short, comparing the structure of this embodiment 1 to the conventional structure shown in FIG. 12, the portion on field oxide film 2 in p-type region 1a, that is a hindrance to titanium silicide formation, has been changed from an $n^+$ portion to a $p^+$ portion. The field region on this field oxide film 2 occupies a relatively large area, compared to the element formation region, so the fact that the polysilicon layer in this portion is changed from $n^+$ to $p^+$ is very effective, when viewed for all of gate electrode wiring 3.

In addition, when n-type polysilicon is changed to p-type polysilicon and titanium silicide is formed, there is also the effect that the electrical resistance will become smaller than when formed on n-type polysilicon.

For example, results when polysilicon was formed into both n-type and p-type polysilicon on a field oxide film, titanium silicide was further formed, and then their electrical resistance was tested, are shown in FIG. 10. The horizontal axis shows electrical resistance and the vertical axis frequency of appearance.

Figure 10A:
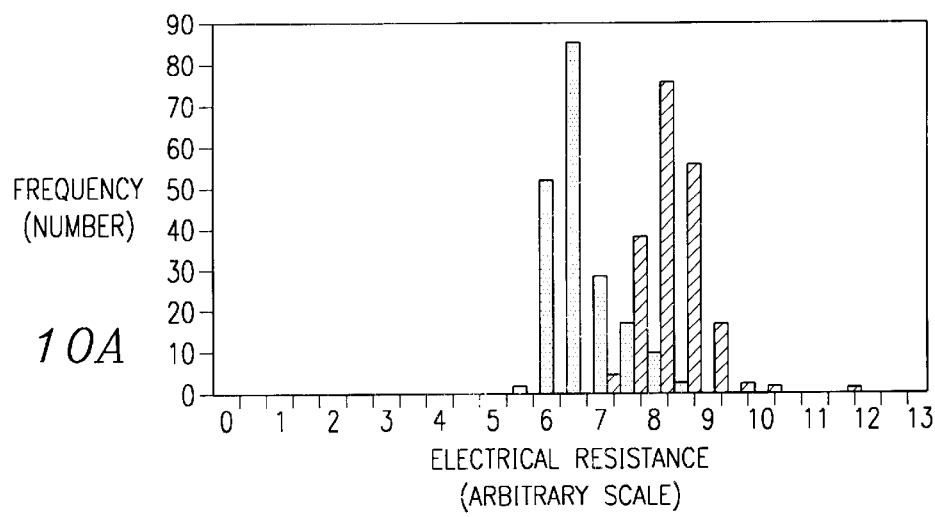
FIG. 10 is a graph showing polysilicon electrical resistance distribution.
Figure 10B:
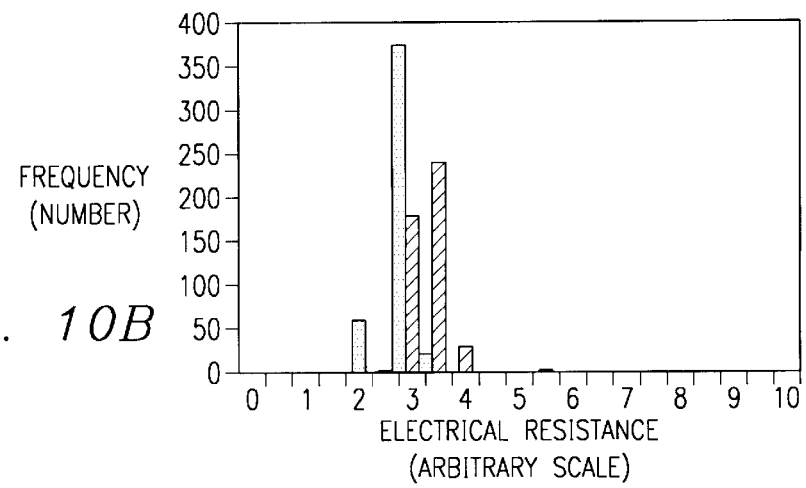

FIG. 10(a) shows a case where polysilicon wire width is 0.45 μm, and FIG. 10(b) as case where polysilicon wire width is 0.55 μm, and in both figures, the vertical axis shows frequency (number) and the horizontal axis electrical resistance (arbitrary scale).

In each figure, n-doped silicon and p-doped silicon are shown in a comparison, and as can be seen from these figures, in each case, the overall electrical resistance of the p-type silicon is smaller than the n-type silicon.

Thus, as in the embodiment 1 discussed above, by changing most portions of the polysilicon layer that is gate electrode wiring 3 from $n^+$ to $p^+$, the overall resistance of gate electrode wiring 3 can be made substantially smaller.

In addition, as can be seen by comparing FIGS. 10(*a*) and (*b*), the difference in electrical resistance of p-type silicon and n-type silicon has a tendency to become greater as the wire width becomes narrower. Thus, the effect of changing the polysilicon layer, that is gate electrode wiring 3, from $n^+$ to $p^+$ to make the overall resistance of gate electrode wiring 3 smaller becomes more effective as the width of gate electrode wiring 3 becomes narrower.

Embodiment 2

Next, by referring to FIGS. 2–9, a embodiment 2 where this invention is applied to an actual silicide (self-aligned silicide) process is explained.

Figure 2:
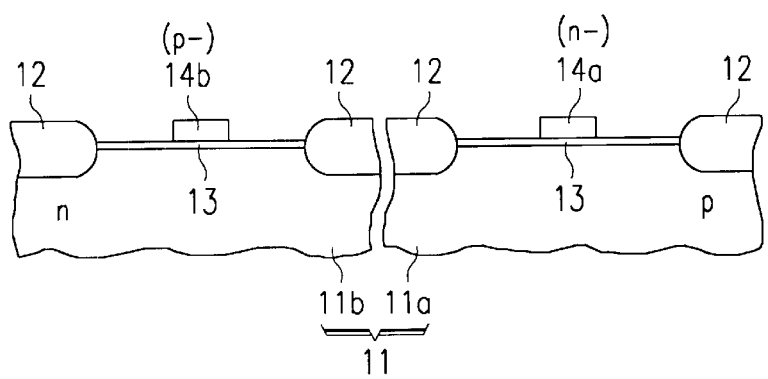
FIGS. 2–9 are schematic cross sections showing the steps of a manufacturing process for a semicounductor device with CMOS construction based on a embodiment 2 of this invention.

First, as shown in FIG. 2, p-type region 11*a*, as well region, and n-type region 11*b* are formed on silicon semiconductor substrate 11, and then field oxide film 12 is formed selectively with LOCOS, for example, delineating element formation regions in each region 11*a* and 11*b*.

Next, after gate oxide film 13 is formed in each element formation region, a polysilicon film is formed over the entire surface, and this polysilicon film is patterned by photolithography and etching to produce a gate electrode wiring pattern (refer to FIG. 1, for example) that passes through each element formation region and over field oxide film 12, outside of the figure. By doing this, as shown, polysilicon film 14*a* is formed in the element formation region of p-type region 11*a* and polysilicon film 14*b* is formed in the element formation region of n-type region 11*b*.

Figure 3:
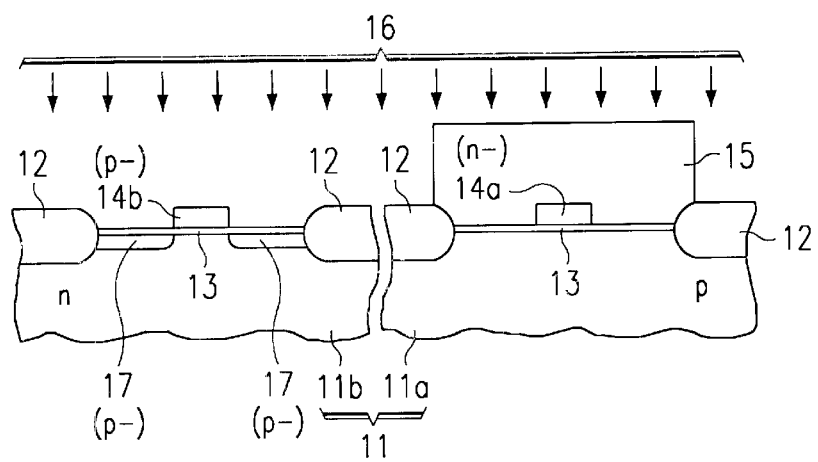

Next, as shown in FIG. 3, the element formation region of p-type region 11*a* is covered by photoresist 15, and the entire surface is implanted with ions of p-type impurity 16, such as boron (B), at a relatively low concentration. By doing this, p-type impurity 16 is introduced at a relatively low concentration into the surface of silicon semiconductor substrate 11 on both sides of polysilicon film 14*b* in the element formation region of n-type region 11*b*, and with subsequent heat treatment, $p^-$ diffusion layer 17 is formed. In addition, at this time, p-type impurity 16 is introduced at a relatively low concentration into polysilicon film 14*b* in the element formation region of n-type region 11*b* and the polysilicon film on field oxide film 12, outside of the figure, that are exposed through photoresist 15.

Figure 4:
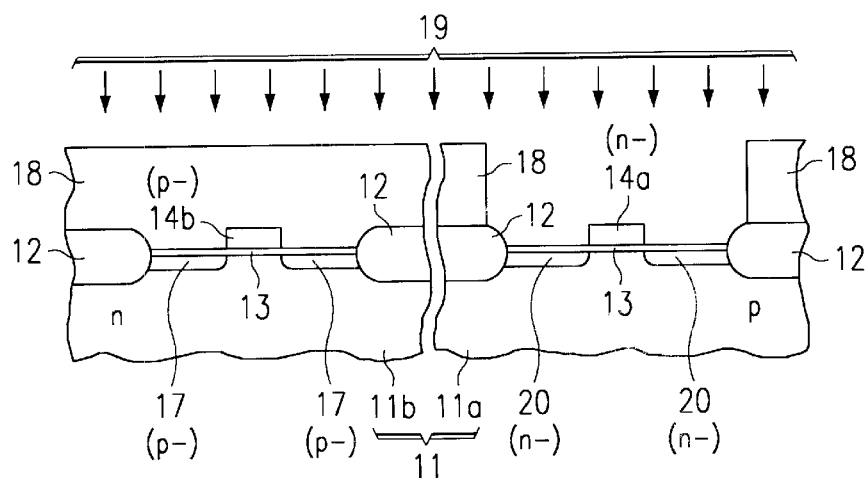

Next, as shown in FIG. 4, after photoresist 15 is removed, now all of the element formation region of n-type region 11*b* and field oxide film 12 are covered by photoresist 18 so that only the element formation region of p-type region 11*a* is exposed. Then, in this state, the entire surface is implanted with ions of n-type impurity 19, such as arsenic (As) or phosphorus (P), at a relatively low concentration. By doing this, n-type impurity 19 is introduced at a relatively low concentration into the surface of polysilicon semiconductor substrate 11 on both sides of polysilicon film 14*a* in the element formation region of p-type region 11, and $n^-$ diffusion layer 20 is formed by subsequent heat treatment. In addition, n-type impurity 19 is introduced at a relatively low concentration into polysilicon film 14*a* in the element formation region of p-type region 11*a*.

In this case, photoresist 18 should be formed into a pattern that will include part of the region covered by photoresist 15 on field oxide film 12. By doing this, a nondoped portion is formed at the boundary of the p-type portion and the n-type portion of the polysilicon film on field oxide film 12. Forming a nondoped portion at the boundary of the p-type portion and the n-type portion of the polysilicon film in this way is so that the boundary will be implanted with ions of both p-type and n-type impurities and so that it will be possible to reliably prevent the subsequent titanium silicide formation state from becoming poor.

Note that the order of the ion implantation process for p-type impurity shown in FIG. 3 and the ion implantation process for n-type impurity 19 shown in FIG. 4 could be reversed.

Figure 5:
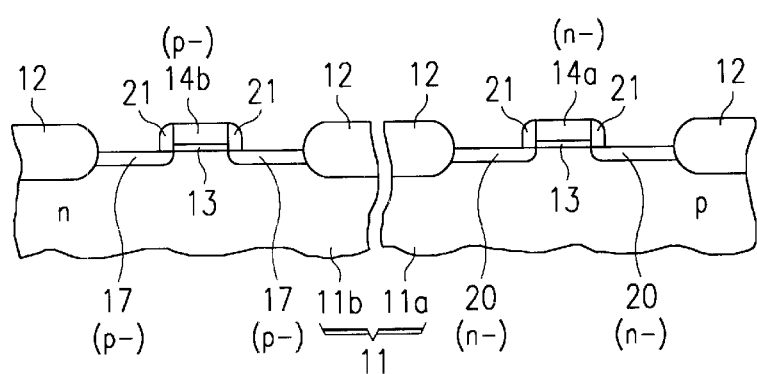

Next, as shown in FIG. 5, after photoresist 18 is removed, a silicon oxide ($SiO_2$) film or silicon nitride (SiN) film is formed over the entire surface and it is anisotropically etched to form side wall insulating film on the sides of polysilicon films 14*a* and 14*b* (and the polysilicon film on field oxide film 12 outside the figure).

Figure 6:
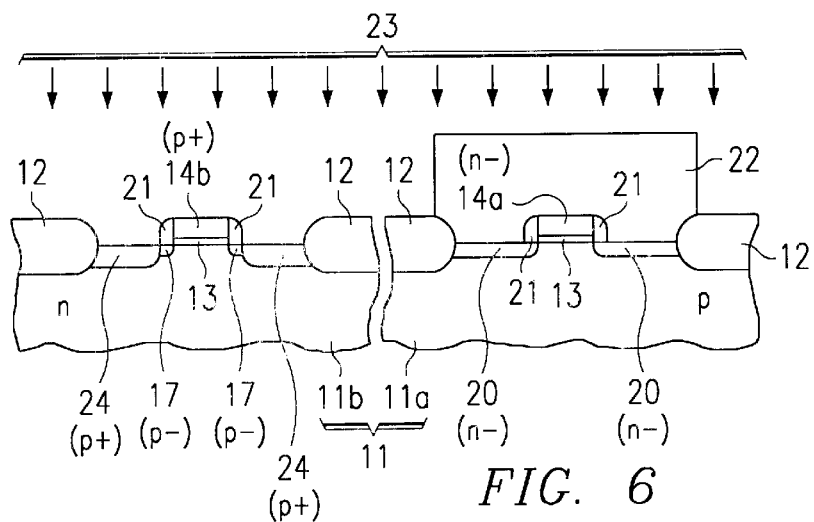

Next, as shown in FIG. 6, the element formation region of p-type region 11*a* is covered by photoresist 22 and the entire surface is implanted with ions of p-type impurity 23), such as boron (B), at a relatively high concentration. By doing this, p-type impurity 23 is introduced at a relatively high concentration into the surface of silicon semiconductor substrate 11 on the outside of side wall insulating film 21 on both sides of polysilicon film 14*b* in the element formation region of n-type region 11*b*), and $p^+$ diffusion layer 24 is formed with subsequent heat treatment. In addition, at this time, p-type impurity 23 is introduced at a relatively high concentration into polysilicon film 14*b* in the element formation region of n-type region 11*b* and into the polysilicon film on field oxide film 12 outside the figure, that are exposed through photoresist 22.

Figure 7:
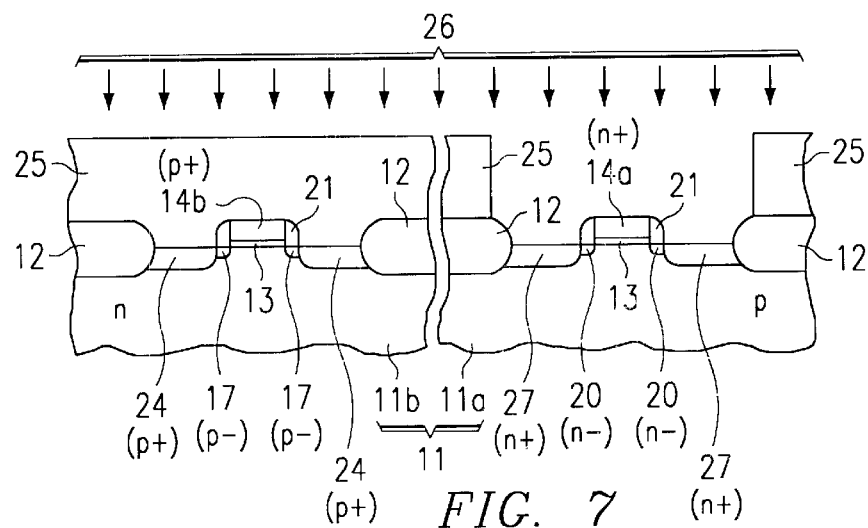

Next, as shown in FIG. 7, after photoresist 22 is removed, now all of the element formation region of n-type region lib and field oxide film 12 are covered by photoresist 25 so that only the element formation region of p-type region 11*a* is exposed. Then, in this state, the entire surface is implanted with ions of n-type impurity 26), such as arsenic (As) or phosphorus (P), at a relatively high concentration. By doing this, n-type impurity 26 is introduced at a relatively high concentration into the surface of polysilicon semiconductor substrate 11 on both sides of polysilicon film 14*a* in the element formation region of p-type region 11*a* and $n^+$ diffusion layer 27 is formed by subsequent heat treatment. In addition, n-type impurity is introduced at a relatively high concentration into polysilicon film 14*a* in the element formation region of p-type region 11*a*.

In this case, for the same reasons as already discussed, photoresist 25 should be formed into a pattern that includes part of the region covered by photoresist 22.

Note that the order of the ion implantation process for p-type impurity 23 shown in FIG. 6 and the ion implantation process for the n-type impurity shown in FIG. 7 could be reversed.

Figure 8:
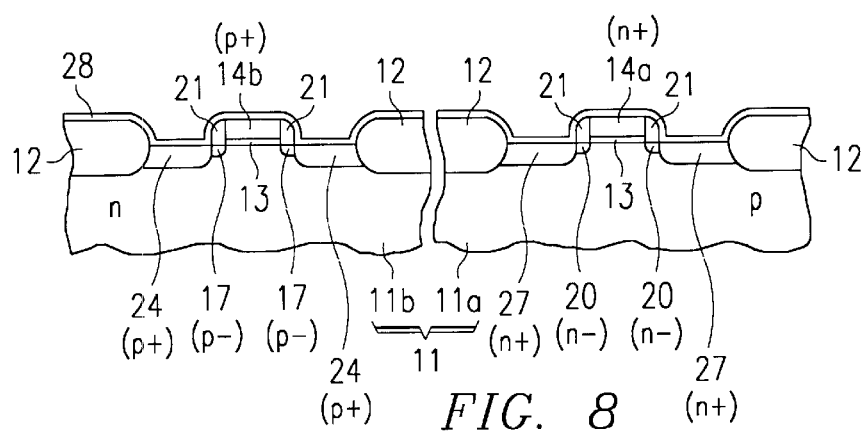

Next, as shown in FIG. 8, after photoresist 25 is removed, titanium (Ti) film 28 is formed over the entire surface.

Figure 9:
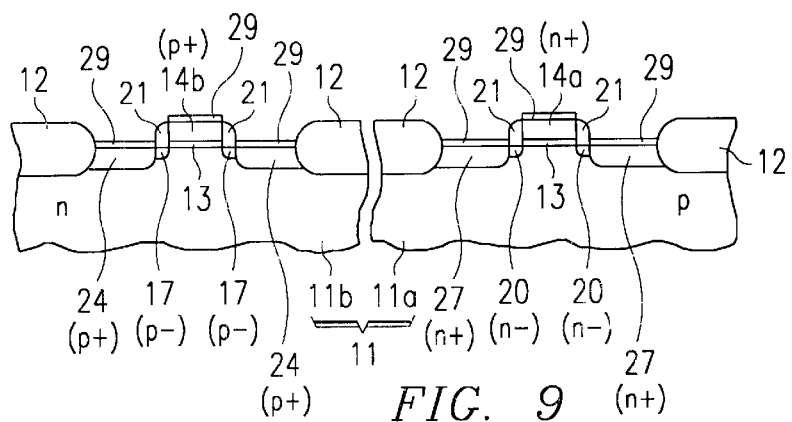

Next, as shown in FIG. 9, heat treatment using short-time annealing (RTA or RTP), for example, is performed to cause the titanium (Ti) and silicon to react, the upper parts of polysilicon films 14*a* and 14*b* and the surface regions of $n^+$ diffusion layer 27 and p⁺ diffusion layer 24 are each silicided, forming titanium silicide (TiSi$_2$) layer 29.

After this, unreacted Ti film 28 on the insulating film is removed by etching.

In this embodiment 2, too, n-type polysilicon film 14a), that is a hindrance to the formation of titanium silicide in particular, is present only on the element formation region of p-type region 11a in the polysilicon film that constitutes the gate electrode wiring, and all the other portions are constituted by p-type polysilicon film 14b), that is comparatively beneficial for titanium silicide formation. Thus, when the upper part of this polysilicon film is silicided to form titanium silicide layer 29), titanium silicide layer 29), that has a sufficiently low resistance, can be formed essentially in nearly all portions of the gate electrode wiring.

Figure 11:
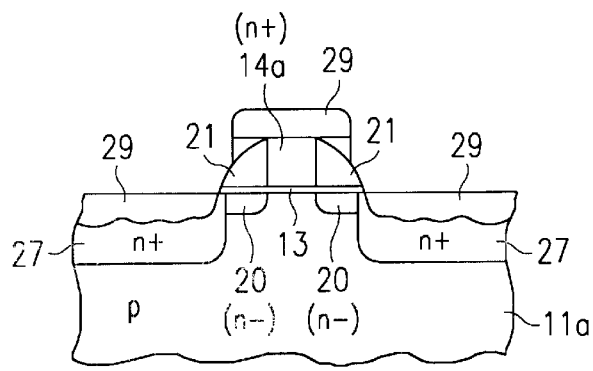
FIG. 11 is a shcematic enlarged cross section showing a variant example of a semiconductor device with CMOS construction based on a embodiment 2 of this invention.

Note that with polysilicon film 14a on the element formation region of p-type region 11a), of course, there remains the problem that the titanium silicide formation state is poor, but as one method of solving this, there is, for example, a method whereby the gate electrode wiring in the portion is made into a two-layer structure, as shown in FIG. 11. In short, a first layer of polysilicon film 14a), that controls the MOSFET gate width, is made narrower, and a second wide polysilicon film is formed on top of it, and this second layer of polysilicon film is silicided to form titanium silicide layer 29. By so doing, a wide and nondoped second layer of polysilicon film can be silicided, so titanium silicide layer 29), that has sufficiently low resistance, can always be formed.

Above, this invention was explained according to embodiments, but this invention is not limited to the embodiments discussed above.

For example, with the embodiment 2 discussed above, this invention is applied to the silicide process in a MOSFET with an LDD (lightly doped drain) structure, but it can also be applied to the silicide process in MOSFETs that are not LDD structures. In addition, it is not limited to the silicide process but can also be applied in cases only the gate electrode wiring is silicided.

With this invention, in the element region of an n-channel MOSFET, n-type impurity is introduced, and in the element region and field region of a p-channel MOSFET, p-type impurity is introduced, into the polysilicon layer that constitutes the common gate electrode wiring of a CMOS structure. Thus, the n-type polysilicon region, that is a hindrance to the formation of low-resistance titanium silicide, for example, will only be the element region of the n-channel MOSFET. Compared to a conventional device where the gate electrode wiring on the field region of a p-type substrate region is also constituted of n-type polysilicon, for example, the part of the gate electrode wiring on the field region in that p-type substrate region that is changed to p-type polysilicon will be beneficial to the formation of low-resistance titanium silicide. The result: titanium silicide with sufficiently low resistance can be formed in essentially nearly all parts of the gate electrode wiring, and the amount of variation in its formation state can be reduced. So, the result is that narrower gate width in MOSFETS, etc., can be achieved, and thus smaller elements and higher integration can be achieved.

In addition, by reducing the n-type polysilicon region, that has comparatively high resistance, over the conventional, lower resistance in the overall gate electrode wiring can be achieved.

Additionally, the constitution of this invention can be manufactured just by changing the photoresist mask pattern of the conventional manufacturing method, and thus it is very simple.

What is claimed is:

1. Semiconductor device comprising:
   an n-channel insulating gate field-effect transistor and a p channel insulating gate field-effect transistor connected by common gate electrode wiring on the principal face of a semiconductor substrate,
   a polysilicon gate wiring layer comprising a first portion of an n type impurity in the element region of said n channel insulating gate field-effect transistor and a second portion of a p-type impurity in the element region and field region of said p-channel insulating gate field-effect transistor and in a field region of said n channel insulating gate field-effect transistor.

2. Semiconductor device described in claim 1 wherein said gate electrode wiring is polysilicide wiring that has a silicide layer on said polycrystal silicon layer.

3. Semiconductor device described in claim 2 wherein said silicide layer is a titanium silicide layer.

* * * * *